United States Patent [19]
Dingwall et al.

[11] 4,010,425
[45] Mar. 1, 1977

[54] CURRENT MIRROR AMPLIFIER

[75] Inventors: Andrew Gordon Francis Dingwall, Somerville; Bruce David Rosenthal, Highland Park, both of N.J.

[73] Assignee: RCA Corporation, New York, N.Y.

[22] Filed: Oct. 2, 1975

[21] Appl. No.: 618,763

[52] U.S. Cl. .................................. 330/35; 323/4; 330/19; 330/22

[51] Int. Cl.[2] ........................................ H03F 3/16

[58] Field of Search .............. 323/4; 330/19, 22, 35

[56] References Cited
UNITED STATES PATENTS

| | | | |
|---|---|---|---|
| 3,813,595 | 5/1974 | Sheng | 323/4 |
| 3,925,718 | 12/1975 | Wittlinger | 323/4 |

Primary Examiner—Rudolph V. Rolinec
Assistant Examiner—Lawrence J. Dahl
Attorney, Agent, or Firm—H. Christoffersen; S. Cohen; R. G. Coalter

[57] ABSTRACT

Unity current gain impedance transformation at the input of a field effect transistor current mirror amplifier reduces the input impedance and renders it independent of the mirror ratio. A net saving of semiconductor material may be obtained for a given mirror ratio and input impedance when the transformation is provided by a common gate connected complementary field effect transistor meeting certain effective threshold voltage and forward transfer conductance ratio requirements.

10 Claims, 5 Drawing Figures

CURRENT MIRROR AMPLIFIER

This invention relates to amplifiers and particularly to current mirror amplifiers employing field effect transistors.

Current mirror amplifiers (hereinafter CMA's) are well known and are widely used in applications requiring an accurately fixed relationship between an input current and one or more output currents. In an operational amplifier or comparator, for example, CMA's are typically employed to supply bias current to the various stages and to perform other functions such as level shifting or differential to single-ended conversion in the input, intermediate or output stages.

Field effect transistor (FET) CMA's are known in which a common source connected input FET is connected at the gate and drain thereof to an input terminal and in which the gate and drain of a common source connected output FET are coupled, respectively, to the input terminal and an output terminal. The input/output current ratio (mirror ratio) of such a CMA may be determined to a good approximation by the ratio of the forward transfer conductance ratios (transconductances) of the input and output FETs and is thus substantially independent of the actual values of the transconductances.

There are parameters of the FET CMA, however, which depend primarily on the magnitude of the transconductance. Chief among these is the mirror input impedance which, to a first approximation, varies inversely as the transconductance of the input transistor. In order to achieve a low input impedance, which is generally desired in a CMA, it has heretofore been necessary to increase the transconductance of the input transistor. This is effective, but requires (for a given mirror ratio) a corresponding increase in the transconductance of the output transistor. Higher transconductance FET's are larger in size than lower transconductance FET's so that the mirror, when in the form of an integrated circuit, requires a larger chip area. This is disadvantageous as it means more expense and, for a "chip" of given size, fewer circuits which can be accommodated. One aspect of the present invention is directed to providing FET CMA's having reduced input impedance which can be implemented without increasing the transconductance of the two CMA transistors, and in a circuit which requires a substantially smaller increase in chip area than in the known art.

Another characteristic of the prior art FET CMA which has proved trouble some in the past is the voltage variations at the mirror input and output terminals. When used, for example, as an active load for a differential amplifier for providing differential to single ended conversion, this voltage variation can cause a substantial reduction in overall circuit bandwidth if the amplifier is of the kind subject to capacitance multiplication by the Miller effect. Another aspect of the present invention is directed to providing differential to single-ended current converters which exhibit relatively small input voltage variations.

The invention is illustrated in the accompanying drawings wherein like elements are designated by like reference numbers and in which.

Figure 1:
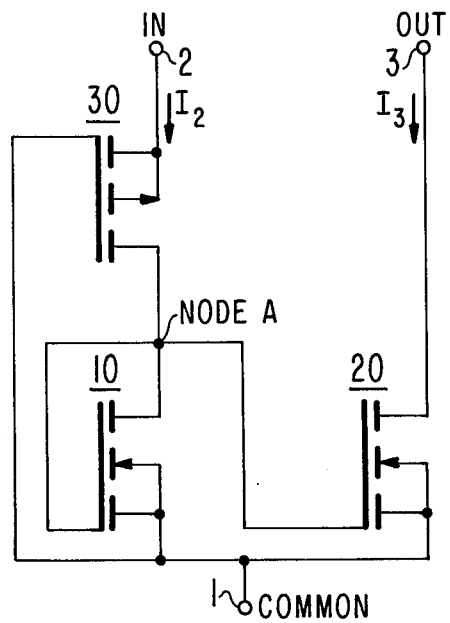
FIG. 1 is a circuit diagram of a CMA embodying the invention.

In the CMA of FIG. 1, transistor 10 is connected at the source and substrate thereof to common terminal 1 and at the gate and drain thereof to node A. Transistor 20 is connected at the source and substrate thereof to common terminal 1 and at the gate and drain thereof, respectively, to node A and output terminal 3. Transistor 30 is connected at the source and substrate thereof to input terminal 2 and at the gate and drain thereof to common terminal 1 and node A, respectively.

Transistors 10 and 20 are metal-oxide semiconductor (MOS) field effect transistors of one conductivity type (here shown as N-channel devices) and transistor 30 is a MOS field effect transistor of opposite conductivity type (here shown as a P-channel device). The conductivity types may be reversed in a given application depending on the relative circuit operating potentials so long as the complementary relationship is maintained. Thus transistors 10 and 20 may be P-channel FET's and transistor 30 may be an N-channel FET.

In operation, assume that common terminal 1 is connected to a reference potential point such as ground and an input current, $I_2$, is applied to input terminal 2. The current $I_2$, flowing through the serially connected conduction paths of FET's 30 and 10 causes FET 10 to operate in the saturation region of its drain characteristic curves and a positive potential to be produced at node A. Since the gate of FET 10 is connected to node A a degenerative effect results which stabilizes the node A potential at an equilibrium value dependent on $I_2$ and parameters of FET 10 such as: (1) its forward transfer conductance ratio, $gm_{10}$; and (2) its threshold voltage, $V_t10$. Note that FET 10 is in the saturation region because the gate and drain thereof are connected in common at node A and it is assumed that current $I_2$ is flowing through the conduction path thereof. Thus, the well known inequality defining operation in the saturation region is necessarily satisfied i.e., the drain voltage is necessarily greater than the gate voltage minus the threshold voltage ($V_d > V_g - V_t$).

As mentioned, the node A potential will stabilize at a value dependent principally on $I_2$, gm 10 and $V_t10$. The gate voltage of FET 20 is therefore proportional to the input current $I_2$. If it is now assumed, that a source of current, $I_3$, is coupled to output terminal 3, that FET 20 is in saturation and that the threshold voltage, $V_t20$, of FET 20 is equal to that of FET 10, the ratio of the currents $I_2$ and $I_3$ may be approximated by:

$$\frac{I_3}{I_2} \approx \frac{gm\ 20}{gm\ 10} \tag{1}$$

This equation states that for unity mirror operation (i.e., for an output current $I_3$ equal to an input current $I_2$) the transconductance of transistor 20 ($gm$ 20) should be equal to that of transistor 10 ($gm$ 10). For different mirror ratios, the transconductances may be appropriately scaled. For example, for current amplification ($I_3 > I_2$) the transconductance of transistor 20 should be greater than that of transistor 10 ($gm$ 20 > $gm$ 10) and for current attenuation ($I_3 < I_2$) the reverse is true ($gm$ 20 < $gm$ 10).

If FET 30 were omitted from the circuit and terminal 2 connected directly to node A, the input impedance $R_i$ of the CMA of FIG. 1 would be, to a good approximation, given by the following equation:

$$R_i \approx \frac{1}{gm\ 10 + gds\ 10} \qquad (2)$$

where $gds\ 10$ is the incremental drain conductance, saturation region, of FET 10. For typical commercially available transistors, $gm >> gds$ so that equation 2 may be simplified to:

$$R_i \approx \frac{1}{gm\ 10} \qquad (3)$$

The problem associated with prior art FET CMA's, particularly when implemented as an integrated circuit, will now be explained with the aid of equations 1 and 3. Recall that the reciprocal conductance term of equation 3 represents what the input impedance, $R_i$, of the CMA of FIG. 1 would be if transistor 30 were omitted from the circuit and terminal 2 connected directly to node A. To reduce the input impedance it is clearly necessary to increase $gm\ 10$. But equation 1 states that for any given mirror ratio an increase in $gm\ 10$ must be accompanied by a proportional increase in $gm\ 20$. Since the transconductance of a FET is dependent directly on device geometry, this means that the size of both transistors (FET's 10 and 20) must be increased to reduce the input impedance and that is a costly approach in terms of semiconductor material.

That problem, the input impedance dependence on the mirror ratio, is avoided according to the invention by means of a unity current gain impedance transformer in the CMA input stage. The transformer makes the input impedance substantially independent of the mirror ratio so that FET's 10 and 20 may be made small area devices thereby conserving semiconductor material. The impedance transformer does, of course, require some space but can be implemented in a manner such that there can be a net reduction in area over that which would otherwise be required for a given mirror ratio and input impedance.

The aforementioned unity current gain impedance transformation is provided in the CMA of FIG. 1 by common gate connected complementary FET 30. Operation of FET 30 and its complex interactive relationship with FET's 10 and 20 may most easily be understood if it is initially assumed that, by some means, FET 30 is operated in the saturation region of its drain characteristic curves. That "means", representing a further aspect of the invention, will be discussed in detail subsequently.

Assuming, therefore, that FET 30 is operated in saturation (as is FET 10, for the reasons previously given), the mirror ratio depends, as before (equation 1), on the transconductance ratio of FET's 20 and 10 but the input impedance $R_i$, at terminal 2 is no longer given by the aforementioned reciprocal conductance terms of equations 1 or 2. Instead, $R_i$, may be approximated by:

$$R_i \approx \frac{(1/(gm\ 10 + gds\ 10)) + rds\ 30}{1 + (gm\ 30)(rds\ 30)} \qquad (4)$$

where $rds\ 30$ represents the incremental drain resistance, saturation region, of FET 30.

Equaton 4 may be simplified by applying the assumption of equation 2 (i.e., $gm\ 10 >> gds\ 10$) and noting that, for typical commercial transistors the product $(gm\ 30)(rds\ 30)$ is much greater than unity, so that:

$$R_i \approx \frac{1}{(gm\ 10)(gm\ 30)(rds\ 30)} + \frac{1}{gm\ 30} \qquad (5)$$

A comparison of equations 5 and 3 illustrates that, for a given value of $gm\ 10$, the input resistance of the three transistor CMA of FIG. 1 (equation 5) may be made less than that of the assumed two transistor mirror (FET's 10 and 20, equation 3) by a suitable choice of the parameters of FET 30. The degree of this improvement (i.e., input resistance reduction) may be appreciated by assuming specific values for the terms of equations 3 and 5. As an example, assume that $gm\ 10$ is $100 \times 10^{-6}$ mho, $gm\ 30$ is $400 \times 10^{-6}$ mho and $rds\ 30$ is $10^4$ ohm. Using these values, the two transistor CMA would have an input resistance of 10,000 ohms while that of the three transistor version would be half that much, 5000 ohms.

Now the circuit of FIG. 1 does employ one more transistor (FET 30) than the simple two transistor CMA (FET's 10 and 20) of the prior art. However, by making $gm\ 30$ large compared to $gm\ 10$, the input resistance $R_1$ of the circuit can be made relatively small without requiring any change in the value of $gm\ 10$ or $gm\ 20$. That is, FET's 10 and 20 may be relatively small area devices (low $gm$) selected for a desired mirror ratio. Thus, even though the circuit has one more transistor, the area occupied by the circuit for a given $R_i$ can be smaller than that required for the two transistor CMA. To give an example, to obtain a given $R_i$ in the prior art, the areas of FET's 10 and 20 may have to be increased by a factor of 10 each. Assuming unit areas initially for transistors 10 and 20, the total area needed for the modified circuit is therefore 20 units. With the present circuit, assuming unit areas initially for FET's 10, 20 and 30, the same result can be achieved (to a good approximation) by increasing the area of FET 30 by a factor of roughly 10 while retaining FET's 10 and 20 of unit areas to give a total area for the circuit of 12 units.

Thus far it has been assumed that FET's 10 and 30 are both operated in the saturation region. Such operation is assured for FET 10, as previously noted, due to the gate-to-drain connections thereof. On the other hand, in the absence of appropriate means (described in detail below), FET 30 could enter the triode region. Since the incremental drain resistance ($rdt\ 30$) of FET 30 in the triode region may typically be as much as one or more orders of magnitude lower than when in the saturation region (i.e., $rdt << rds$), the effect of operation in the triode region is that the mirror input impedance would be increased by FET 30 rather than decreased. This can be avoided, according to a further aspect of the invention, when the current $I_2$ is less than a minimum value by causing the ratio of the effective threshold voltages, $Vt(eff.)$, of FET's 10 and 30 to satisfy the following inequality:

$$Vt(eff.)30 > Vt(eff.)10 \qquad (6)$$

This inequality may be satisfied, according to yet another aspect of the invention by either of two techniques. In the example of FIG. 1, device parameters (such as gate oxide thickness, gate oxide dielectric constant, substrate doping level, and the like) are selected to satisfy inequality 6. Alternatively, as shown in FIG. 2, substrate bias is employed to increase the threshold voltage of FET 30 such that inequality 6 is satisfied.

Figure 2:
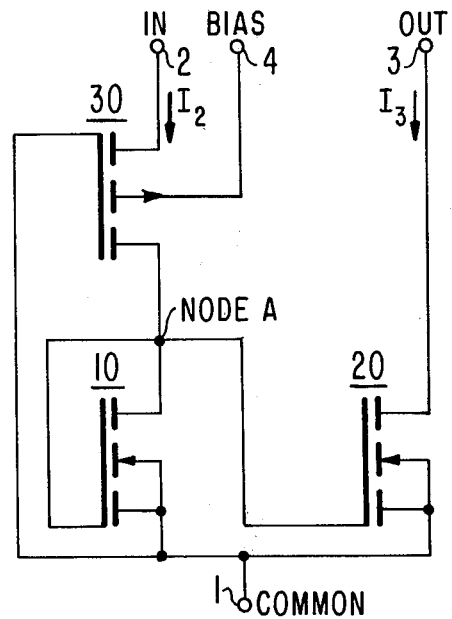
FIG. 2 is a circuit diagram illustrating a modification of the CMA of FIG. 1.

In more detail, in FIG. 2, the substrate electrode of transistor 30 is disconnected from the drain thereof and coupled instead to bias input terminal 4. The device threshold voltages of FET's 10 and 30 may be of any appropriate value. In operation, however, bias is applied to bias terminal 4 of a value to increase the effective threshold voltage of FET 30 to a level greater than that of FET 10 thereby satisfying inequality 6. Operation is otherwise as that previously described for the CMA of FIG. 1.

It has been explained that satisfaction of inequality 6 is a necessary condition to assure that FET 30 operates in saturation and when so operated (and the transconductance ratio requirement is met) the advantage of reduced input impedance is achieved. This will hereafter be called the normal mode of operation.

It is a further feature of the CMA of the invention that even though inequality 6 is fully met, FET 30 can nevertheless be forced into the triode region under certain conditions to thereby achieve a second mode of circuit operation. That mode, hereafter referred to as the high impedance mode, is achieved by letting the input current, $I_2$, increase to greater than the given value previously referred to. In the high impedance mode, the advantage of current limiting may be obtained in certain circuit applications.

In more detail, the node A voltage is a function of the parameters of FET 10 and also of the current $I_2$ as previously explained. As $I_2$ increases, the node A voltage also increases. When $I_2$ is of a value such that magnitude of the drain-to-source voltage of transistor 30 is less than the magnitude of the difference of the gate-to-source and threshold voltages, FET 30 will enter the triode region.

$$|V_{ds}\ 30\ |<|V_{gs}\ 30 - V_t\ 30| \tag{7}$$

When inequality 7 is satisfied, the input impedance at input terminal 2 becomes, to a good approximation:

$$R_i \approx rdt\ 30 + 1/gm\ 10 \tag{8}$$

where $R_i$ and $gm\ 10$ are defined as before and $rdt\ 30$ is the incremental drain resistance, triode region, of FET 30.

The first term of this equation represents the "full-on" resistance of FET 30 and is negligibly small but the latter term is quite large, much larger in fact (under the given temperature regarding $gm\ 30$ and $gm\ 10$) than the total input resistance given by equation 5. The net result of this is that when the input current $I_2$, is less than a given value, FET 30 is in saturation and $R_i$ (given by equation 5) is low. When $I_2$ exceeds the given value, FET 30 is forced into the triode region (i.e., inequality 7 is satisfied) due to the voltage developed at node A and $R_i$ changes to a high value (equation 8). The current level at which this impedance change occurs depends upon the parameters of FET's 10 and 30 and may be calculated by known circuit analysis techniques.

As mentioned, the high impedance mode can provide the advantage of current limiting in certain circuit applications. An example of such an application is one in which the input current, $I_2$, is supplied to input terminal 2 by a signal source having a Thevenin equivalent output resistance that is less than that given by equation 8 but greater than that given by equation 5. In the normal mode, the current $I_2$ would thus be principally determined by the Thevenin equivalent voltage and resistance values but in the high impedance mode would be determined mainly by the Thevenin voltage and $R_i$ of equation 8 and thus be limited. Of course, the equivalent output impedance of all real sources is less than infinite as a practical matter and thus some measure of current limiting always is present as FET 30 changes from operation in the saturation region to the triode region. The previous example of a source impedance bounded by equations 5 and 8 represents merely the optimum relationship where the maximum current limiting effect can be observed and is, of course, not essential to the principal object of the invention.

Figure 3:
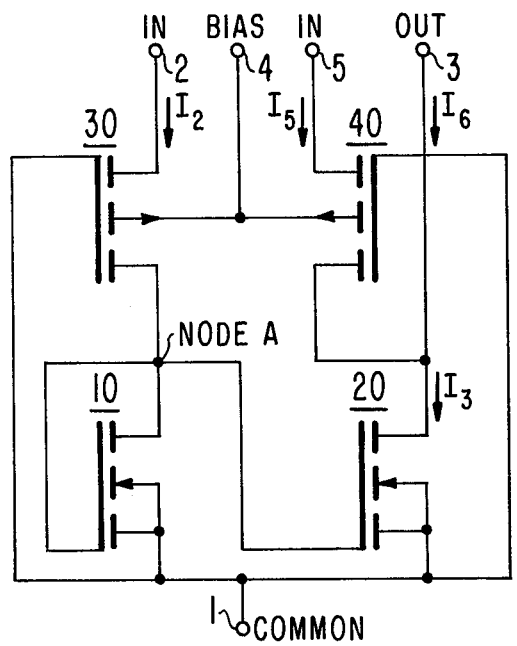
FIG. 3 is a circuit diagram illustrating a modification of the CMA of FIG. 2 for providing differential to single-ended current conversion.

In FIG. 3 the CMA of FIG. 2 is modified to include a further input terminal 5 and P-channel enhancement mode FET 40. The source, gate, drain and substrate of FET 40 are connected, respectively, to input terminal 5, common terminal 1, output terminal 3 and bias terminal 4. Thus modified, the CMA of FIG. 3 provides differential to single-ended conversion of input currents $I_2$ and $I_5$. That is, an output current, $I_6$, is produced having a sense dependent on the relative magnitudes of input currents $I_2$ and $I_5$ and the mirror ratio (equation 3). The magnitude of the output current, $|I_6|$, also depends on those factors and certain other factors as well including the operating modes of FET's 40 and 20 and the nature of the load (not shown) to which output terminal 3 is connected.

In more detail, the purpose of FET 40 is much the same as FET 30, namely, to reduce the input impedance at input terminal 5. One advantage of this, as previously mentioned, is that when the CMA of FIG. 3 is employed as the active load in a differential amplifier, the reduced input impedance at both input terminals minimizes the voltage variation thereat. Such variations otherwise could result in undersired capacitance multiplication by the Miller effect in the source supplying the input currents thereby limiting unduly the overall circuit bandwidth. In order to accomplish that purpose, parameters of FET 40 should be selected in a manner similar to that described for FET 30. The manner of selection and the overall circuit operation may be understood by considering the following specific example for linear operation at unity gain.

Assume that the effective threshold voltages of FET's 30 and 40 are greater than those of FET's 10 and 20, respectively. Assume also that $gm\ 10 = gm\ 20$ (i.e., unity current gain), that $gm\ 30 >> gm\ 10$ and that $gm\ 40 >> gm\ 20$. Assume further that input currents $I_2$ and $I_5$ are applied to input terminals 2 and 5 respectively and are of a level such that all transistors are operated in saturation. For this to occur, it is necessary according to the invention to also assume that Vt (eff.) $30 > Vt$ (eff.) 10 and that $Vt$ (eff.) $40 > Vt$(eff.) 20. Finally, assume that output terminal 3 is coupled to a utilization device, such as another amplifier or a load, having a real component of impedance, $R_L$, which may be finite or infinite.

Under these assumptions, the input resistance $R_i(2)$ at input terminal 2 may be estimated with good accuracy by equation 5 (or 4) as previously discussed. The input resistance, $R_i$ (5), at input terminal 5 is approximated, assuming $(gm\ 40)\ (rds\ 40) >> 1$, by the following expression:

$$R_i(5) \approx \frac{1}{gm\ 40} + \frac{(R_L)\ (rds\ 20)}{(gm\ 40)\ (rds\ 40)\ (R_L + rds\ 20)} \quad (9)$$

The significant difference between the input resistance given by equation 5 and that of equation 9 is the presence in the latter of the load resistance term $R_L$. As will now be explained in detail, the input impedance at terminal 5 may be decreased without increasing the transconductance of FET 20 (which would affect its size and, more importantly, the mirror ratio) regardless of whether the load resistance is finite or infinite. In other words, the input impedance at terminal 5 may be reduced for both low and high impedance loads and this may be done independently of the mirror ratio.

Assume that the load or utilization means is an FET amplifier and that output terminal 3 is solely coupled to the FET gate electrode. $R_L$, in such an application may, for all practical purposes, be considered infinite (the gate leakage resistance being typically $10^7$ ohms of greater). With such a load, equation 9 simplifies to:

$$R_i(5) \approx \frac{1}{gm\ 40} + \frac{rds\ 20}{(gm\ 40)\ (rds\ 40)} \quad (10)$$

Since the denominator of the second term of this equation, as previously explained, is typically much greater than one, it is apparent that, for a given incremental drain resistance, saturation region, for FET 20, that the input impedance may be reduced independently of $R_L$ and $gm$ 20 by increasing the transconductance of FET 40.

Similarly, if one were to assume that output terminal 3 were connected instead to a relatively low impedance load, the aforementioned benefits are still obtained. As an example, assume that $R_L$ is relatively low, much lower in fact than the incremetal drain resistance (saturation regin) of FET 20. In that case equation 9 simplifies to:

$$R_i(5) \approx \frac{1}{gm\ 40} + \frac{R_L}{(gm\ 40)\ (rds\ 40)} \quad (11)$$

In this case it is thus clear that for a given value of $R_L$, the input resistance at terminal 5 may be reduced by increasing the transconductance of FET 40 and, as before, this may be done without increasing the transconductance of FET 20 so that the mirror ratio is unaffected.

Summarizing, in the CMA of FIG. 3, the input impedance at both input terminals is lowered and made substantially independent of the mirror ratio by common-gate connected FET's 30 and 40. This is achieved, by operating all transistors in saturation, which in turn is made possible by satisfaction of the following inequalities:

$$gm\ 30 > gm\ 10 \quad (12)$$
$$gm\ 40 > gm\ 20 \quad (13)$$
$$Vt(eff.)\ 30 > Vt(eff.)10 \text{ and} \quad (14)$$
$$Vt(eff.)40 > Vt(eff.)20 \quad (15)$$

Figure 4:
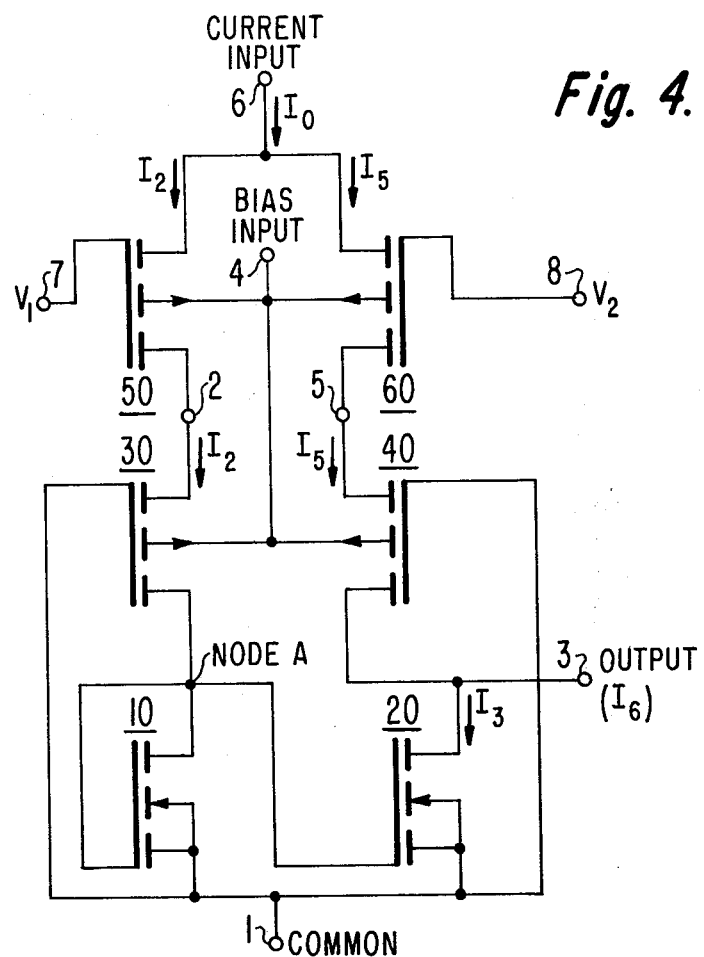
FIGS. 4 and 5 are circuit diagrams illustrating modifications of the circuit of FIG. 3 for providing differential voltage to single-ended current conversion.

In FIG. 4, the circuit of FIG. 3 is modified for providing differential voltage to single-ended current conversion. The modification comprises the addition of two voltage input terminals, 7 and 8, a current input terminal 6, and two additional P-channel enhancement-mode FET's 50 and 60. The source, substrate, gate and drain of FET 50 are connected, respectively, to terminals 6, 4, 7 and 2. The source, substrate, gate and drain of FET 60 are connected, respectively, to terminals 6, 4, 8 and 5.

In operation, an input current, $I_6$, is applied to terminal 6 from a suitable current source (not shown). The current source could be a resistor connected between terminal 6 and a source of operating potential but, preferably, is a constant current source such as a suitably bised transistor. Such sources are well known in the art. Common source connected FET's 50 and 60 apportion the input current, $I_6$, between terminals 2 and 5 in accordance with the relative values of input voltages $V_1$ and $V_2$ applied to input terminals 7 and 8, respectively.

Preferably, FET's 50 and 60 have similar characteristics (equal threshold voltages and transconductances, for example) so that when the input voltages are balanced, currents $I_2$ conducted by FET 50) and $I_5$ (that conducted by FET 60) are balanced. In that case, assuming further that the mirror ratio is unity (i.e., $gm$ 10 equals $gm$ 20), current $I_3$ will equal current $I_2$ so that the net output current, $I_6$, will be zero. Thus, under the given assumptions, common mode components of the input voltages are rejected.

Any difference between the input voltages will result (due to Kirchoff's current law) in an output current having a sense dependent upon the relative magnitudes of the input voltages $V_1$ and $V_2$. For example, when the voltage $V_2$ is more positive than $V_1$ (relative to common terminal 1), the current $I_2$ will be greater than $I_5$. Under the given assumptions, $I_3$ will also be greater than $I_5$ so that the output current $I_6$ will flow from the load (not shown) to terminal 3. Reversing the relative magnitudes of the input voltages produces the opposite result.

It is a feature of this example of the invention that since FET's 30 and 40 maintain the impedance of terminals 2 and 5 relatively low, the drain voltage variations of FET's 50 and 60 are minimized. Accordingly, multiplication of the gate-drain capacitances associated with FET's 50 and 60 (due to the Miller effect) is reduced and this results in the benefit of extended high frequency performance.

Figure 5:
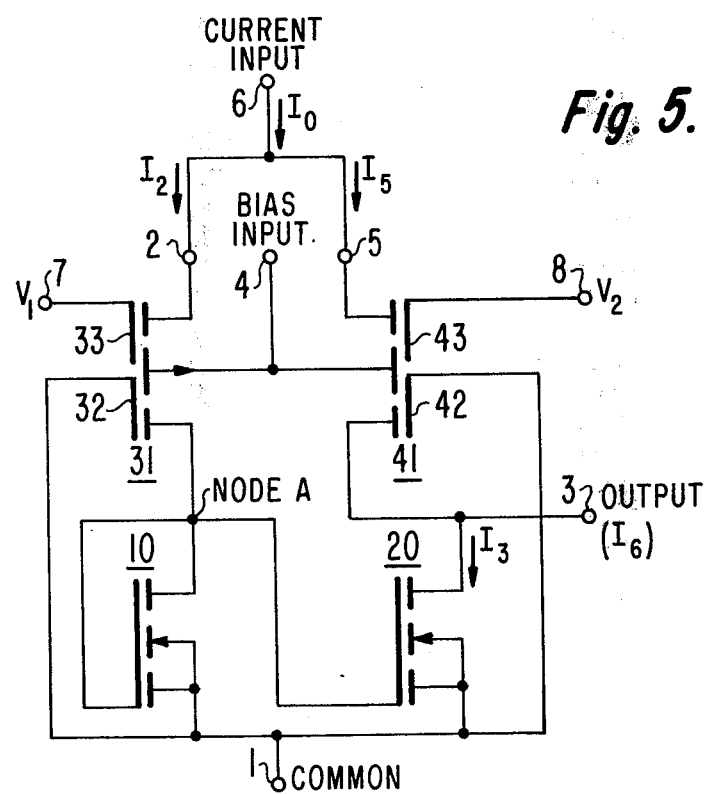

The advantages of FIG. 4 may be obtained without the necessity of additional transistors 50 and 60 if the circuit of FIG. 3 is modified as shown in FIG. 5. There, single gate FET's 30 and 40 have been replaced by dual gate FET's 31 and 41, respectively, each having a first gate closer to the drain thereof (32 and 42, respectively) and a second gate closer to the source thereof (33 and 43, respectively). As in FIG. 4, a current input terminal 6, is provided for receiving an input current $I_6$ and two voltage input terminals 7 and 8 are provided for receiving the input voltages $V_1$ and $V_2$, respectively.

Under the condition that the transconductance and threshold voltage characteristic of the first gate 32 of FET 31 are greater than the corresponding parameters of FET 10, and the transconductance and threshold voltage characteristic of the first gate 42 of FET 41 are greater than the corresponding parameter of FET 20, the circuit of FIG. 5 operates and achieves the advantages of that of FIg. 4 but with the further advantage of economy of implementation in eithr discrete or integrated circuit form. By either method of construction there is a net reduction in the number of transistors and the total number of interconnections required.

What is claimed is:

1. A current mirror amplifier, comprising, in combination:
   an input terminal, a common terminal, an output terminal and a node;
   first and second field effect transistors of a first conductivity type, the source electrode of each being coupled to said common terminal, the gate electrode of each and the drain electrode of the first being coupled to said node, the drain electrode of the second being coupled to said output terminal; and amplifier means having an input electrode coupled to said input terminal, an output electrode coupled to said node and a control electrode coupled to said common terminal for maintaining the impedance between said input terminal and said common terminal at a value less than the reciprocal of the transconductance of said first field effect transistor.

2. A current mirror amplifier, comprising, in combination:
   an input terminal, a common terminal, an output terminal and a node
   first and second field effect transistors of a first conductivity type, the source electrode of each being coupled to said common terminal, the gate electrode of each and the drain electrode of the first being coupled to said node, the drain electrode of the second being coupled to said output terminal; and
   means coupled to said input terminal, said common terminal and said node for maintaining the input impedance of said input terminal at a value less than the reciprocal of the transconductance of said first field effect transistor, said means comprising a third field effect transistor of a second conductivity type, said third field effect transistor being coupled at the source, gate and drain electrodes thereof, respectively, to said input terminal, said common terminal and said node.

3. The current mirror amplifier as recited in claim 2 wherein the transconductance and the threshold voltage of said third field effect transistor are greater than the transconductance and the threshold voltage of said first field effect transistor.

4. The current mirror amplifier as recited in claim 2 wherein the transconductance of said third field effect transistor is greater than the transconductance of said first field effect transistor and further comprising:
   a bias input terminal;
   a substrate electrode in said third field effect transistor; and
   means coupling said bias input terminal to said substrate terminal for applying a bias thereto of a value such that the threshold voltage of said third field effect transistor is greater than that of said first field effect transistor.

5. The combination recited in claim 2 further comprising:
   a further input terminal;
   a fourth field effect transistor of said second conductivity type, said fourth field effect transistor being connected at the source, gate and drain electrodes thereof, respectively, to said further input terminal, said common terminal and said output terminal.

6. The combination recited in claim 5 further comprising:
   a bias input terminal;
   a substrate electrode in each of said third and fourth field effect transistors; and
   means coupling each said substrate electrode to said bias input terminal.

7. The combination recited in claim 5 further comprising circuit means for applying first and second input currents, respectively, to said input terminal and said further input terminal.

8. The combination recited in claim 7 wherein said circuit means comprises:
   current source means;
   fifth and sixth field effect transistors of said second conductivity type, the source electrodes thereof being connected to said current source means, the gate electrodes thereof for receiving first and second input signal voltages; and
   means coupling the drain electrode of the fifth transistor to said input terminal and the drain electrode of said sixth transistor to said further input terminal.

9. The combination recited in claim 5 further comprising:
   a current input terminal for receiving a source of current;
   means coupling said current input terminal to said input terminal and said further input terminal;
   a further gate in each of said third and fourth field effect transistors, each further gate for receiving a separate input signal voltage, each further gate being proximate to the source electrode of its respective field effect transistor.

10. A current mirror amplifier, comprising, in combination:
    an input terminal, a common terminal, an output terminal and a node;
    first and second field effect transistors of a first conductivity type, the source electrode of each being coupled to said common terminal, the gate electrode of each and the drain electrode of the first being coupled to said node, the drain electrode of the second being coupled to said output terminal; and
    a third field effect transistor of a second conductivity type, said third field effect transistor being connected at the source, gate and drain electrodes thereof, respectively, to said input terminal, said common terminal and said node.

* * * * *